(12) United States Patent  
Moon et al.

(10) Patent No.: US 8,754,414 B2
(45) Date of Patent: Jun. 17, 2014

(54) ORGANIC LIGHT-EMITTING DISPLAY DEVICE AND METHOD OF MANUFACTURING THE SAME

(75) Inventors: Sang-Ho Moon, Yongin (KR); Joon-Hoo Choi, Yongin (KR); Chun-Gi You, Yongin (KR); Kyu-Sik Cho, Yongin (KR); Jong-Hyun Park, Yongin (KR)

(73) Assignee: Samsung Display Co., Ltd. (KR)

( * ) Notice: Subject to any disclaimer, the term of this patent is extended or adjusted under 35 U.S.C. 154(b) by 264 days.

(21) Appl. No.: 13/337,569

(22) Filed: Dec. 27, 2011

(65) Prior Publication Data

US 2013/0032803 A1 Feb. 7, 2013

(30) Foreign Application Priority Data

Aug. 4, 2011 (KR) .......................... 10-2011-0077848

(51) Int. Cl.
*H01L 29/04* (2006.01)
*H01L 29/10* (2006.01)
*H01L 31/00* (2006.01)

(52) U.S. Cl.
USPC .................................. 257/59; 257/72; 257/83

(58) Field of Classification Search
USPC ........... 257/59, 72, 71, 40, 79, 80, 81, 82, 83, 257/84, 85, 86, 99, 100, 103, 431, 432, 257/433; 438/22, 34, 29, 39, 42, 46
See application file for complete search history.

(56) References Cited

U.S. PATENT DOCUMENTS

2009/0267074 A1 10/2009 Kwon et al.
2012/0074413 A1* 3/2012 Kim ............................. 257/59

FOREIGN PATENT DOCUMENTS

| KR | 1020030052621 | 6/2003 |
| KR | 1020050075128 | 7/2005 |
| KR | 1020060100902 | 9/2006 |
| KR | 100908236 | 7/2009 |
| KR | 1020110085859 | 7/2011 |

* cited by examiner

*Primary Examiner* — Thanh Y Tran
(74) *Attorney, Agent, or Firm* — Knobbe Martens Olson & Bear LLP

(57) ABSTRACT

An OLED device includes an active layer on a substrate; a first insulating layer covering the active layer, and including a first opening and a first insulation island in the first opening, separated from an inner surface of the first opening; a gate electrode on the first insulating layer including gate bottom and top electrodes; a pixel electrode on the first insulation island on the same layer as the gate bottom electrode; source and drain electrodes insulated from the gate electrode and electrically connected to the active layer; a second insulating layer between the gate and the source and drain electrodes, and including a second opening exposing the pixel electrode; a light-reflecting portion in the openings, and surrounding the pixel electrode; an intermediate layer on the pixel electrode and including an organic emissive layer; and an opposite electrode facing the pixel electrode with the intermediate layer interposed between them.

23 Claims, 7 Drawing Sheets

ORGANIC LIGHT-EMITTING DISPLAY DEVICE AND METHOD OF MANUFACTURING THE SAME

CROSS-REFERENCE TO RELATED APPLICATIONS

This application claims the benefit of Korean Patent Application No. 10-2011-0077848, filed on Aug. 4, 2011, in the Korean Intellectual Property Office, the disclosure of which is incorporated herein in its entirety by reference.

BACKGROUND

1. Field

The present disclosure relates to organic light-emitting display devices and methods of manufacturing the same, in which a manufacturing process is simplified and the light efficiency of the organic light-emitting display devices is improved.

2. Description of the Related Technology

Flat panel display devices, such as organic light-emitting display devices or liquid crystal display devices, are manufactured on a substrate on which a pattern including a thin film transistor (TFT), a capacitor, and wirings for connecting these elements are formed. In general, in order to form minute patterns including TFTs on a substrate, on which a flat panel display device is to be formed, the patterns are transferred to an array substrate by using a mask in which the minute patterns are formed.

However, in an operation of transferring patterns using a mask, first, a mask including desired patterns has to be prepared, and thus the manufacturing costs for preparing the mask increase as the number of processes using a mask increases. Also, because complicated operations as described above need to be conducted, a manufacturing process is complicated and the time for manufacture is increased, thereby increasing manufacturing costs.

SUMMARY OF CERTAIN INVENTIVE ASPECTS

One or more embodiments of the present invention provide organic light-emitting display devices and methods of manufacturing the same, in which a manufacturing process is simplified and the light efficiency of the organic light-emitting display devices is improved.

According to one aspect, there is provided an organic light-emitting display device including: an active layer formed on a substrate; a first insulating layer formed on the substrate, the first insulating layer covering the active layer and including a first opening and a first insulation island, where the first insulation island is formed in the first opening, and is separated from an inner surface of the first opening; a gate electrode formed on the first insulating layer insulating the gate electrode from the active layer, the gate electrode including a gate bottom electrode and a gate top electrode; a pixel electrode formed on the first insulation island on the same layer as the gate bottom electrode of the gate electrode; source and drain electrodes insulated from the gate electrode and electrically connected to the active layer; a second insulating layer disposed between the gate electrode and the source and drain electrodes, the second insulating layer including a second opening exposing the entire pixel electrode; a light-reflecting portion formed in the first opening and the second opening, and surrounding the pixel electrode; an intermediate layer formed on the pixel electrode and including an organic emissive layer; and an opposite electrode facing the pixel electrode with the intermediate layer between the opposite electrode and the pixel electrode.

Inner surfaces of the first opening and the second opening can be connected to each other.

A gap can be formed between an outer edge of the pixel electrode and an inner surface of the second opening, and the light-reflecting portion can be disposed in the gap.

A first side of the light-reflecting portion can be at the height of an upper surface of the pixel electrode, and a second side of the light-reflecting portion can be at the height of an upper surface of the second insulating layer.

The light-reflecting portion can directly contact the pixel electrode.

The light-reflecting portion can include the same material as the source and drain electrodes.

The organic light-emitting display device can further include a third insulating layer disposed on the source and drain electrodes and the light-reflecting portion, the third insulating layer including a third opening exposing a center portion of the pixel electrode.

The organic light-emitting display device can further include an auxiliary layer disposed between the substrate and the active layer, where the auxiliary layer includes a fourth opening having an inner surface connected to an inner surface of the first opening, and a second insulation island formed in the fourth opening and separated from the inner surface of the fourth opening.

The light-reflecting portion can be formed in the fourth opening.

The gate bottom electrode and the pixel electrode can include a transparent conductive material.

The transparent conductive material can include at least one material selected from the group consisting of indium tin oxide (ITO), indium zinc oxide (IZO), zinc oxide (ZnO), indium oxide ($In_2O_3$), indium gallium oxide (IGO), and aluminum zinc oxide (AZO).

The opposite electrode can be a light reflective electrode.

The organic light-emitting display device can further include: a capacitor bottom electrode formed on the same layer as the active layer, the capacitor bottom electrode including a semiconductor material doped with impurities; and a capacitor top electrode formed on the same layer as the gate bottom electrode to correspond to the capacitor bottom electrode, the capacitor top electrode including a transparent conductive material.

The second insulating layer can further include a fifth opening exposing the whole capacitor top electrode.

The first insulating layer can further include a sixth opening having an inner surface connected to an inner surface of the fifth opening and a third insulation island formed in the sixth opening and separated from an inner surface of the sixth opening, where the third insulation island corresponds to the capacitor top electrode.

According to another aspect, there is provided a method of manufacturing an organic light-emitting display device, the method including: forming a semiconductor layer on a substrate, where the semiconductor layer is patterned to form an active layer; sequentially stacking a first insulating layer, a first conductive layer, and a second conductive layer on the active layer, where the first conductive layer and the second conductive layer are patterned to form a first electrode pattern and a gate electrode; forming a second insulating layer on the first electrode pattern and the gate electrode, where the first insulating layer and the second insulating layer are patterned to form a plurality of openings that expose the whole first electrode pattern and portions of the active layer; forming a third conductive layer on the second insulating layer, where the third conductive layer is patterned to form source and drain electrodes that are electrically connected to the active layer, and the second conductive layer which constitutes the first electrode pattern is removed to form a pixel electrode and to form a light-reflecting portion in the plurality of openings to surround the pixel electrode; and forming a third insulating layer on the pixel electrode and the light-reflecting portion, where the third insulating layer is patterned to expose a center portion of the pixel electrode.

The method can further include doping the active layer with impurities to form source and drain areas.

The method can further include patterning the second insulating layer to form a second opening that exposes the whole first electrode pattern, and patterning the first insulating layer at the same time to form a first opening connected to the second opening and a first insulation island in the first opening, where the first insulation island is separated from the first opening and corresponds to the first electrode pattern.

The method can further include forming an auxiliary layer on the substrate, includes patterning the auxiliary layer to form a fourth opening connected to the first opening and the second opening and a second insulation island in the fourth opening, where the second insulation island is separated from an inner surface of the fourth opening and corresponds to the first insulation island.

The method can further include forming an intermediate layer including an emissive layer and an opposite electrode on the pixel electrode.

The method can further include patterning the semiconductor layer to form a capacitor bottom electrode on the same layer as the active layer, and patterning the first conductive layer and the second conductive layer to form a second electrode pattern which is used to form a capacitor top electrode corresponding to the capacitor bottom electrode.

The method can further include patterning the first insulating layer and the second insulating layer to form openings that expose the whole second electrode pattern.

The second conductive layer can constitute the second electrode pattern can be removed to form the capacitor top electrode, and where the method further includes doping the capacitor bottom electrode with impurities.

BRIEF DESCRIPTION OF THE DRAWINGS

The above and other features and advantages will become more apparent by describing certain embodiments with reference to the attached drawings in which.

DETAILED DESCRIPTION OF CERTAIN INVENTIVE EMBODIMENTS

Figure 1:
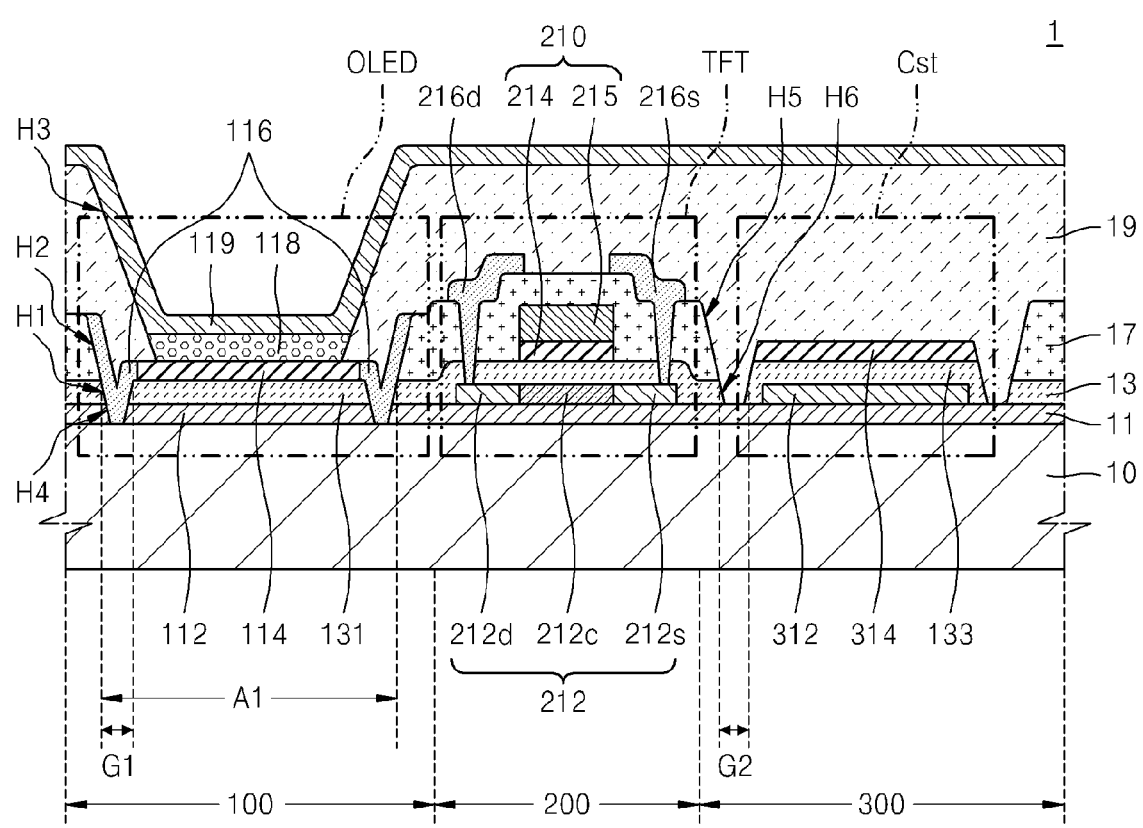
FIG. 1 is a schematic cross-sectional view illustrating an embodiment of an organic light-emitting display device.

As the invention allows for various changes and numerous embodiments, certain embodiments will be illustrated in the drawings and described in detail in the written description. However, this is not intended to limit the present invention to particular modes of practice, and it is to be appreciated that all changes, equivalents, and substitutes that do not depart from the spirit and technical scope of the present invention are encompassed in the present invention. In the description, certain detailed explanations of related art are omitted when it is deemed that they may unnecessarily obscure the essence of the invention.

While such terms as "first," "second," etc., may be used to describe various components, such components must not be limited to the above terms. The above terms are used only to distinguish one component from another.

The terms used in the present specification are merely used to describe embodiments, and are not intended to limit the present invention. An expression used in the singular encompasses the expression of the plural, unless it has a clearly different meaning in the context. In the present specification, it is to be understood that the terms such as "including" or "having," etc., are intended to indicate the existence of the features, numbers, steps, actions, components, parts, or combinations thereof disclosed in the specification, and are not intended to preclude the possibility that one or more other features, numbers, steps, actions, components, parts, or combinations thereof may exist or may be added.

The present invention will now be described more fully with reference to the accompanying drawings, in certain embodiments of the invention are shown.

FIG. 1 is a schematic cross-sectional view illustrating an embodiment of an organic light-emitting display device 1.

Referring to FIG. 1, the organic light-emitting display device 1 includes a light emission area 100 comprising an organic light-emitting device (OLED), a thin film transistor (TFT) area 200 comprising a driving TFT and a switching TFT for driving the OLED, and a storage area 300 comprising a capacitor Cst.

The TFT area 200 includes a driving TFT that is electrically connected to the OLED to supply a current and a switching TFT that is electrically connected to the capacitor Cst, or the like. The TFT_includes an active layer 212, a gate electrode 210, and source and drain electrodes 216s and 216d. The gate electrode 210 is formed of a gate bottom electrode 214 and a gate top electrode 215. The gate bottom electrode 214 is formed of a transparent conductive material. A first insulating layer 13, which is a gate insulating layer for insulating the gate electrode 210 from the active layer 212, is interposed between the gate electrode 210 and the active layer 212. Source and drain areas 212s and 212d that are highly doped with impurities are formed at two sides of the active layer 212, and a channel area 212c is between the source and drain areas 212s and 212d; the source and drain areas 212s and 212d are electrically connected to the source and drain electrodes 216s and 216d, respectively. While a top gate type TFT is illustrated in FIG. 1, the TFT is not limited thereto; various types of TFTs such as a bottom gate type TFT can also be used in other embodiments.

The capacitor Cst is formed in the storage area 300. The capacitor Cst charges a signal to be applied to the driving TFT even after the switching TFT is turned off. The capacitor Cst includes two electrodes, namely, a capacitor bottom electrode 312 and a capacitor top electrode 314, and the first insulating layer 13 therebetween. The capacitor bottom electrode 312 may be formed on the same layer as the active layer 212. The capacitor bottom electrode 312 may be formed of a semiconductor material and is doped with impurities and thus has an increased electric conductivity. The capacitor top electrode 314 may be formed on the same layer and of the same material as the gate bottom electrode 214 and a pixel electrode 114.

In the light emission area 100, the OLED is formed. The OLED includes the pixel electrode 114 that is electrically connected to one of the source electrode 216s and the drain electrode 216d of the driving TFT, an opposite electrode 119 facing the pixel electrode 114, and an intermediate layer 118 interposed between the pixel electrode 114 and the opposite electrode 119. The pixel electrode 114 may be formed on the same layer as the gate bottom electrode 214 and comprises a transparent conductive material. The opposite electrode 119 is formed of a light reflective electrode. The intermediate layer 118 includes an organic emissive layer (EML). Thus, the organic light-emitting display device 1 of FIG. 1 is a bottom emission type light-emitting display device in which light is emitted toward a substrate 10. In some embodiments, the OLED further includes a light-reflecting portion 116 that surrounds the pixel electrode 114 and reflects light emitted from the intermediate layer 118 in all directions, toward the substrate 10.

Figure 2:
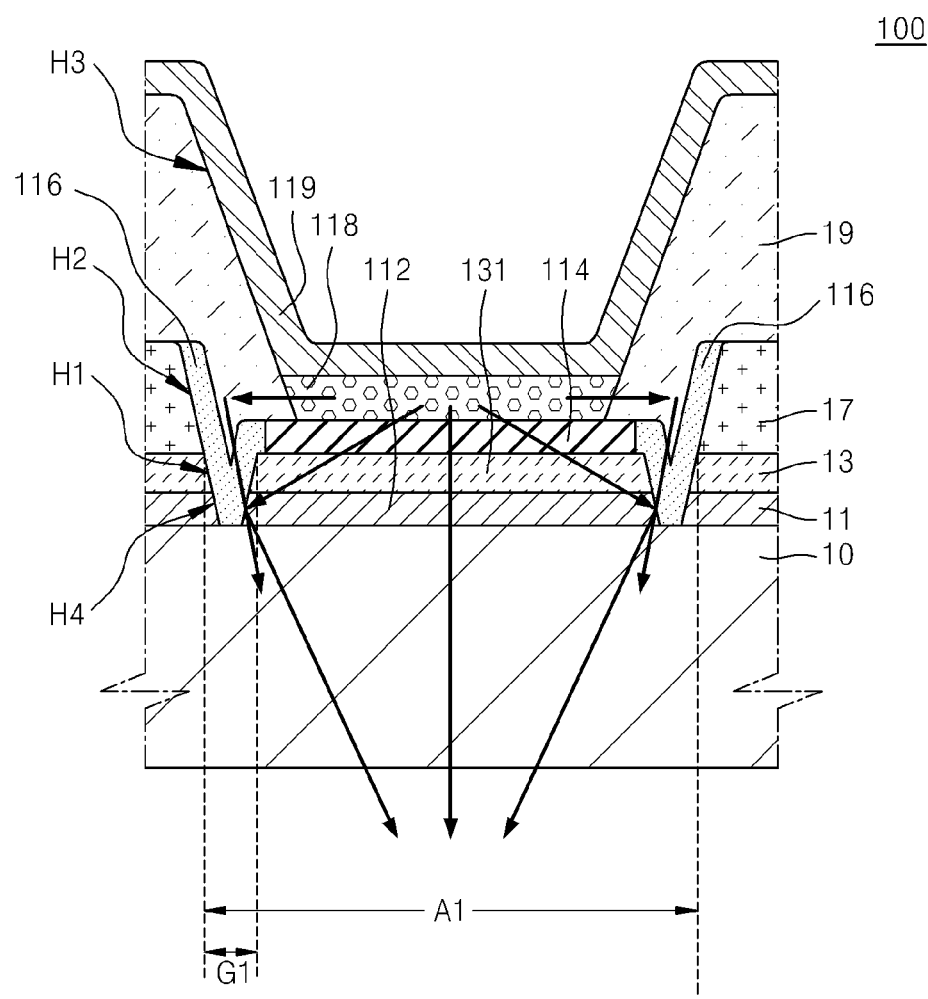
FIG. 2 is a schematic cross-sectional view illustrating a light emission area of FIG. 1.
Figure 3:
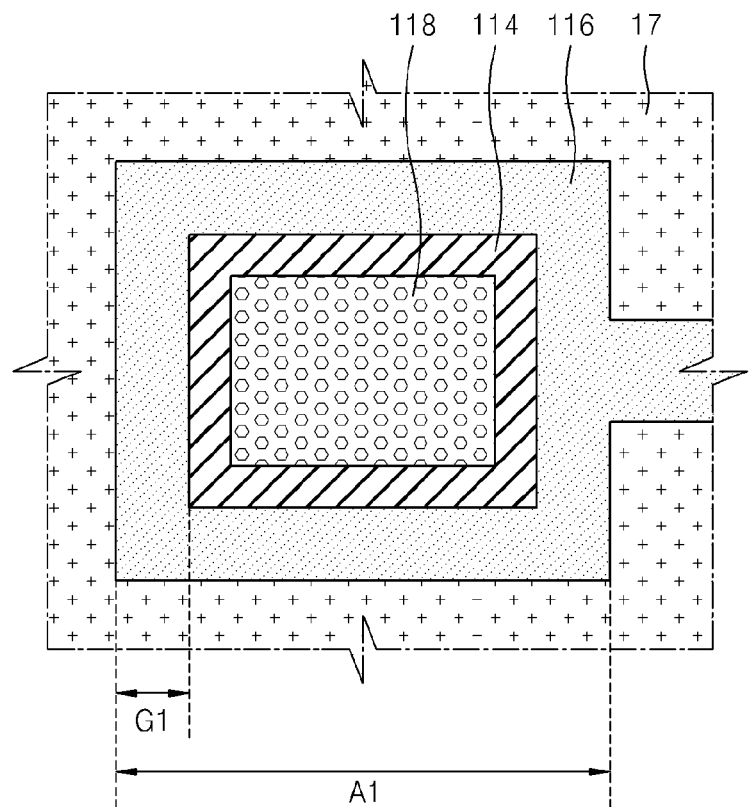
FIG. 3 is a schematic plan view illustrating the light emission area of FIG. 1.

FIG. 2 is a schematic cross-sectional view illustrating the light emission area 100 of FIG. 1, and FIG. 3 is a schematic plan view illustrating the light emission area 100 of FIG. 1.

Referring to FIG. 2, an auxiliary layer 11, the first insulating layer 13, and a second insulating layer 17 are sequentially formed in the light emission area 100, and first, second, and fourth openings H1, H2, and H4 connected to one another are formed in the auxiliary layer 11, the first insulating layer 13, and the second insulating layer 17, respectively. First and second insulation islands 131 and 112 that are separated from inner surfaces of the first, second, and fourth openings H1, H2, and H4 and disposed under the pixel electrode 114 are formed in the first, second, and fourth openings H1, H2, and H4 by a first gap G1. The pixel electrode 114 is formed on the (first and second) insulation islands 131 and 112. The light-reflecting portion 116 is filled in the first gap G1. A first side of the light-reflecting portion 116 surrounds an outer edge surface of the pixel electrode 114 and outer surfaces of the (first and second) insulation islands 131 and 112, and a second side of the light-reflecting portion 116 surrounds the inner surfaces of the first, second, and fourth openings H1, H2, and H4 of the first insulating layer 13, second insulating layer 17, and the auxiliary layer 11. Also, the first side of the light-reflecting portion 116 is formed at the height of an upper surface of the pixel electrode 114, and the second side of the light-reflecting portion 116 is formed at the height of an upper surface of the second insulating layer 17.

The light-reflecting portion 116 reflects light emitted from the OLED in all directions toward the substrate 10, thereby increasing light efficiency of the organic light-emitting display device 1. The light-reflecting portion 116 is formed on the same layer and of the same material as the source and drain electrodes 216s and 216d. The light-reflecting portion 116 is formed at the same time as the source and drain electrodes 216s and 216d, and thus the number of manufacturing processes of the organic light-emitting display device 1 is not increased. In addition, the second insulating layer 17 and the first insulating layer 13 are not interposed between the light-reflecting portion 116 and the pixel electrode 114, and the light-reflecting portion 116 therefore directly contacts the pixel electrode 114, thereby reducing loss of light into the second insulating layer 17 and the first insulating layer 13 and further increasing light reflection efficiency of the light-reflecting portion 116. Also, the light-reflecting portion 116 is formed higher than the pixel electrode 114, and thus light emitted above the pixel electrode 114 may be effectively reflected toward the substrate 10. The light-reflecting portion 116 is formed to also surround the first and second insulation islands 112 and 131 disposed under the pixel electrode 114, thereby effectively reflecting also light that proceeds through the first and second insulation islands 112 and 131 toward the substrate 10. The directions of light reflections are indicated by the arrows in FIG. 2.

Referring to FIG. 3, the light-reflecting portion 116 is formed to surround the pixel electrode 114 in a closed loop, and thus light emitted from the intermediate layer 118 may be reflected toward the substrate 10 more effectively. The light-reflecting portion 116 directly contacts the pixel electrode 114. Also, the light-reflecting portion 116 may contact the driving TFT to electrically connect the pixel electrode 114 and the driving TFT. However, the pixel electrode 114 and the driving TFT are not limited as illustrated in FIG. 3 and they can also be electrically connected to each other differently, without via the light-reflecting portion 116 in other embodiments. An area Al illustrated in FIGS. 1 through 3 is where the second opening H2 is formed.

FIGS. 4 through 10 are schematic cross-sectional views illustrating an embodiment of a method of manufacturing the organic light-emitting display device 1 of FIG. 1.

Figure 4:
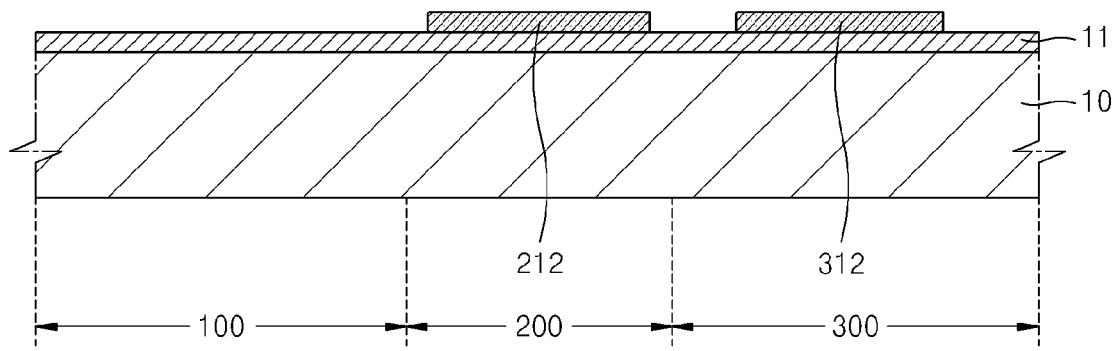
FIGS. 4 through 10 are schematic cross-sectional views illustrating an embodiment of a method of manufacturing the organic light-emitting display device of FIG. 1.

As illustrated in FIG. 4, an auxiliary layer 11 is formed on a substrate 10. The substrate 10 can be formed of a transparent glass material including $SiO_2$. The substrate 10 can also be formed of a transparent plastic material, a metal, or other substrate materials in other embodiments.

The auxiliary layer 11, such as a barrier layer, a blocking layer, and/or a buffer layer, on an upper surface of the substrate 10 prevents diffusion of impurity ions and penetration of moisture or air into the substrate 10, and planarizes a surface of the substrate 10. The auxiliary layer 11 can be formed of $SiO_2$ and/or $SiN_x$ using various deposition methods such as a plasma-enhanced chemical vapor deposition (PECVD) method, an atmospheric pressure CVD (APCVD) method, a low pressure CVD method, or the like.

An active layer 212 is formed on the auxiliary layer 11 in the TFT area 200, and a capacitor bottom electrode 312 is formed in the storage area 300.

First, an amorphous silicon layer (not shown) is deposited on the auxiliary layer 11, and then, the amorphous silicon layer is crystallized to form a polycrystalline silicon layer (not shown). The amorphous silicon layer may be crystallized using various methods such as a rapid thermal annealing (RTA) method, a solid phase crystallization (SPC) method, an excimer laser annealing (ELA) method, a metal-induced crystallization (MIC) method, a metal-induced lateral crystallization (MILC) method, a sequential lateral solidification (SLS) method, and the like. The polycrystalline silicon layer is patterned into the active layer 212 of the TFT and the capacitor bottom electrode 312 by using a mask operation using a first mask (not shown).

In some embodiments, the active layer 212 and the capacitor bottom electrode 312 are separated but they can also be formed as a single unit in other embodiments.

Figure 5:
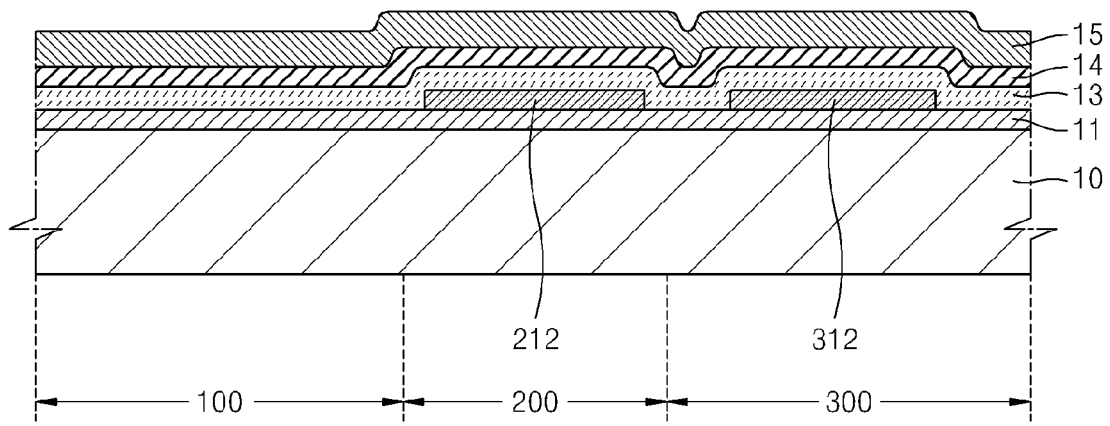

Next, as illustrated in FIG. 5, a first insulating layer 13, a first conductive layer 14, and a second conductive layer 15 are sequentially formed on the substrate 10 on which the active layer 212 and the capacitor bottom electrode 312 are formed.

The first insulating layer 13 can be deposited as an inorganic insulating layer such as, for example, $SiN_X$ or $SiO_X$ by using a PECVD method, an APCVD method, an LPCVD method, or the like. The first insulating layer 13 is interposed between the active layer 212 and a gate electrode 210 of a TFT to function as a gate insulating layer and is also interposed between a capacitor top electrode 314 (see FIG. 1) and the capacitor bottom electrode 312 to function as a dielectric layer of a capacitor Cst.

The first conductive layer 14 can comprise at least one material selected from the group consisting of transparent materials such as indium tin oxide (ITO), indium zinc oxide (IZO), zinc oxide (ZnO), and indium oxide ($In_2O_3$), indium gallium oxide (IGO), and aluminum zinc oxide (AZO). Subsequently, the first conductive layer 14 may be patterned into a pixel electrode 114 (see FIG. 1), a gate bottom electrode 214 (see FIG. 1), and the capacitor top electrode 314 (see FIG. 1).

The second conductive layer 15 can comprise at least one material selected from the group consisting of Ag, Mg, Al, Pt, Pd, Au, Ni, Nd, Ir, Cr, Li, Ca, Mo, Ti, W, MoW, and Cu. The second conductive layer 15 can be formed in a three-layer structure of Mo—Al—Mo. Subsequently, the second conductive layer 15 may be patterned into a gate top electrode 215 (see FIG. 1).

Figure 6:
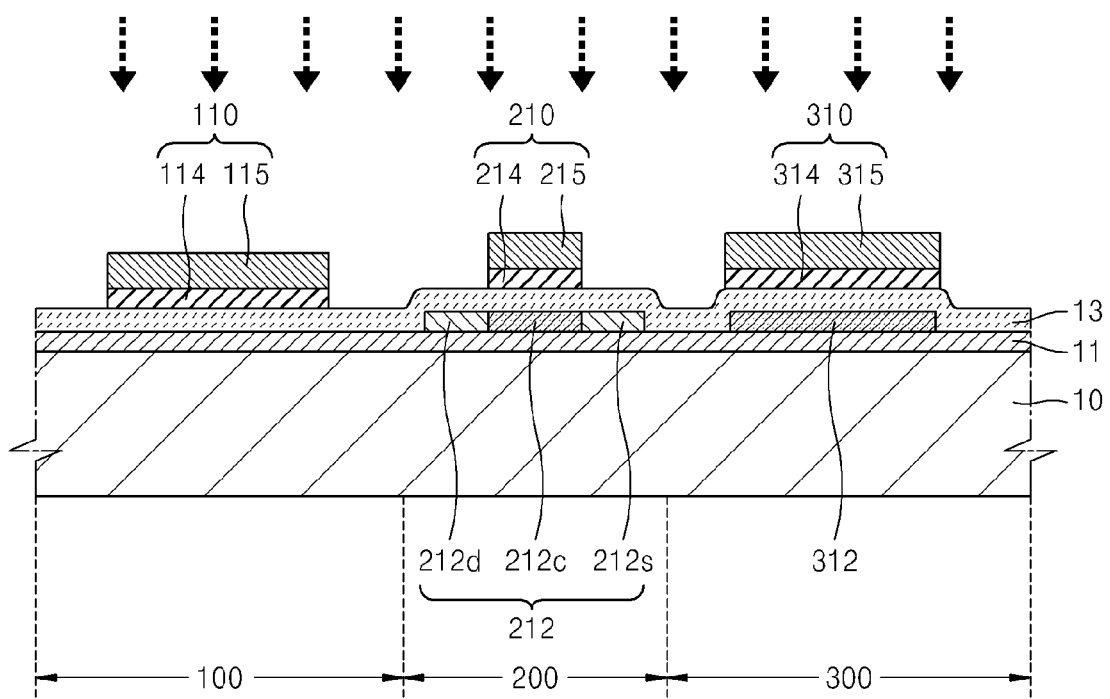

Next, as illustrated in FIG. 6, a first electrode pattern 110, a gate electrode 210, and a second electrode pattern 310 are formed on the substrate 10.

The first conductive layer 14 (see FIG. 5) and the second conductive layer 15 (see FIG. 5) that are sequentially stacked on the entire surface of the substrate 10 are patterned in a mask operation using a second mask (not shown).

The gate electrode 210 is formed above the active layer 212 in the transistor area 200, and the gate electrode 210 comprises the gate bottom electrode 214 that is formed from a portion of the first conductive layer 14 (see FIG. 5) and the gate top electrode 215 that is formed from a portion of the second conductive layer 15 (see FIG. 5).

The gate electrode 210 is formed to correspond to a center portion of the active layer 212; by using the gate electrode 210 as a self-aligned mask, the active layer 212 is doped with n-type or p-type impurities to form source and drain areas 212s and 212d at sides of the active layer 212 and a channel area 212c therebetween. The impurities may be boron (B) ions or phosphor (P) ions.

In the storage area 300, the second electrode pattern 310, which is to be formed later into the capacitor top electrode 314, is formed on the capacitor bottom electrode 312, and in the light emission area 100, the first electrode pattern 110, which is to be formed later into the pixel electrode 114, is formed.

Figure 7:
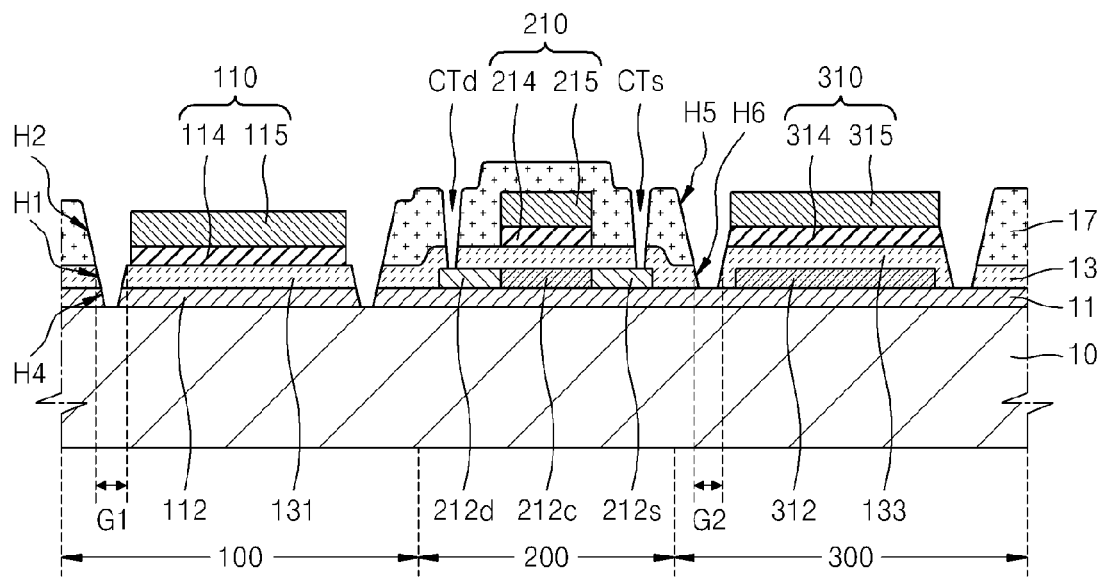

Next, referring to FIG. 7, a second insulating layer 17 is deposited on a resultant product of the operation of FIG. 6, and the first insulating layer 13 and the second insulating layer 17 are both patterned to form contact holes CTd and CTs and first, second, fourth, fifth, and sixth openings H1, H2, H4, H5, and H6 that expose portions of the source and drain area 212s and 212d of the active layer 212, the whole first electrode pattern 110, and the whole second electrode pattern 310.

The second insulating layer 17 can be formed using at least one organic insulating material selected from the group consisting of polyimide, polyamide, acrylic resin, benzocyclobutene, and phenolic resin, by using a method such as a spin coating method. The second insulating layer 17 is formed to have a sufficient thickness, for example, to have a thickness that is greater than a thickness of the first insulating layer 13, to function as an interlayer insulating layer between the gate electrode 210 and the source and drain electrodes 216s and 216d. The second insulating layer 17 can be formed of not only the above-described organic insulating material but, in other embodiments, of an inorganic insulating material like the first insulating layer 13, or in yet other embodiments, by including an organic insulating material and an inorganic insulating material.

The first insulating layer 13 and the second insulating layer 17 are patterned using a mask operation using a third mask (not shown) to form the contact holes CTs and CTd and the first, second, fourth, fifth, and sixth openings H1, H2, H4, H5, and H6.

The contact holes CTs and CTd are formed in the first insulating layer 13 and the second insulating layer 17 in order to respectively expose portions of the source and drain areas 212s and 212d.

In order to expose the whole first electrode pattern 110, the second opening H2 is formed in the second insulating layer 17. A predetermined first gap G1 is formed between an outer edge of the first electrode pattern 110 and the inner surface of the second opening H2. In order to form the first gap G1, when etching the second insulating layer 17, the first insulating layer 13 and the auxiliary layer 11 disposed under the first insulating layer 13 can be over-etched according to an etching solution and an etching method, to have an undercut. Accordingly, when forming the second opening H2, the first opening H1 having an inner surface connected to an inner surface of the second opening H2 is formed in the first insulating layer 13 at the same time. The first insulating layer 13 under the first electrode pattern 110 is patterned into a first insulation island 131 that is separated from an inner surface of the first opening H1. When forming the first opening H1, at the same time, the fourth opening H4, which has an inner surface connected to those of the first and second openings H1 and H2, is formed. The auxiliary layer 11 under the first electrode pattern 110 and the first insulation island 131 is patterned into a second insulation island 112 that is separated from an inner surface of the fourth opening H4. As described below, the light-reflecting portion 116 (see FIG. 1) is formed in the first, second, and fourth openings H1, H2, and H4 of the first insulating layer 13, the second insulating layer 17, and the auxiliary layer 11.

To expose the whole second electrode pattern 310, the fifth opening H5 is formed in the second insulating layer 17. A predetermined second gap G2 is formed between an outer edge of the second electrode pattern 310 and an inner surface of the fifth opening H5. When forming the fifth opening H5, at the same time, the sixth opening H6 having an inner surface connected to an inner surface of the fifth opening H5 is formed in the first insulating layer 13. Here, the first insulating layer 13 under the second electrode pattern 310 is patterned into a third insulation island 133 which is separated from an inner surface of the sixth opening H6. FIG. 7 illustrates that the first insulating layer 13 is over-etched to have an undercut when etching the second insulating layer 17 in order to form the second gap G2. In other embodiments, an undercut is further formed in the auxiliary layer 11 or not formed in the first insulating layer 13. Also, as illustrated in FIG. 7, the fifth opening H5 can be formed to expose the whole second electrode pattern 310 or only a portion of the second electrode pattern 310 if desired. As described below, a third insulating layer 19 (see FIG. 1) may be filled in the first, second, fifth, and sixth openings H1, H2, H5, and H6 of the first insulating layer 13 and the second insulating layer 17, thereby preventing electrical problems which may occur due to over-etching.

Figure 8:
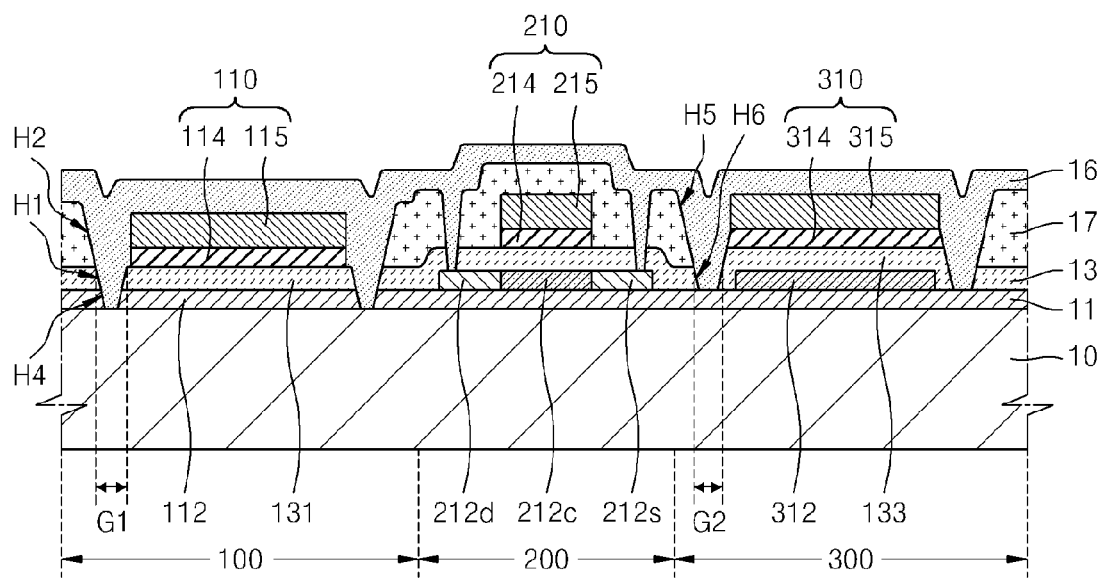

Next, referring to FIG. 8, a third conductive layer 16 is formed on the entire surface of the substrate 10 to cover the second insulating layer 17.

The third conductive layer 16 can be formed using the same conductive material as the first conductive layer 14 (see FIG. 14) or the second conductive layer 15 (see FIG. 15), or other conductive materials. The conductive material of the third conductive layer 16 is deposited thick enough to fill the space between the first, second, fourth, and fifth openings H1, H2, H4, and H5.

Figure 9:
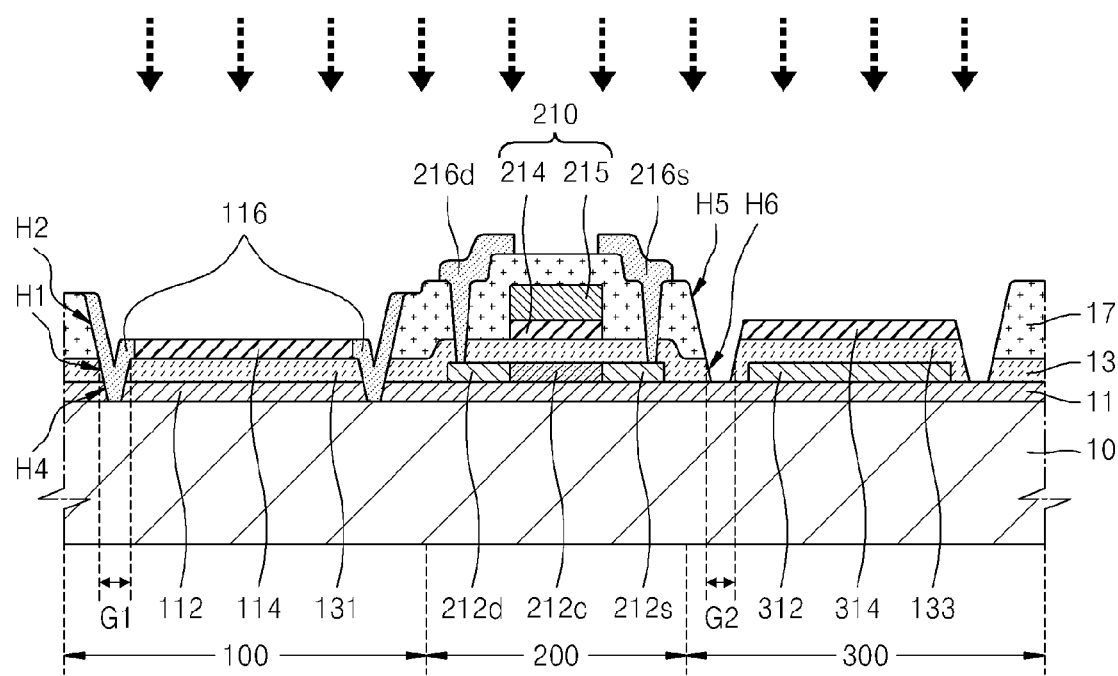

Next, referring to FIG. 9, the third conductive layer 16 (see FIG. 8) is patterned to form source and drain electrodes 216s and 216d, a light-reflecting portion 116, the pixel electrode 114, and the capacitor top electrode 314.

The third conductive layer 16 is patterned using a mask operation using a fourth mask (not shown), thereby forming the source and drain electrodes 216s and 216d and the light-reflecting portion 116.

While not shown in FIG. 9, one of the source electrode 216s and the drain electrode 216d is formed to contact the pixel electrode 114. For example, the light-reflecting portion 116 surrounding the pixel electrode 114 contacts the drain electrode 216d, thereby transmitting an electrical signal from the drain electrode 216d to the pixel electrode 114. The drain electrode 216d can also contact the pixel electrode 114 in other manners.

According to some embodiments, when forming the source and drain electrodes 216s and 216d, the light-reflecting portion 116 is formed at the same time. The third conductive layer 16 (see FIG. 8) is filled also in the first opening H1, the second opening H2, and the fourth opening H4, and thus the light-reflecting portion 116 that surrounds the inner surfaces of the first opening H1, the second opening H2, and the fourth opening H4 and surrounds outer surfaces of the first insulation island 131 and the second insulation island 112 may be formed. A first side of the light-reflecting portion 116 is formed at the height of an upper surface of the pixel electrode 114, which is to be formed later, and the second side of the light-reflecting portion 116 is formed at the height of an upper surface of the second insulating layer 17. Accordingly, light emitted in all directions from the intermediate layer 118 (see FIG. 1) disposed on the pixel electrode 114 can be efficiently reflected toward the substrate 10.

When forming the source and drain electrodes 216s and 216d and the light-reflecting portion 116, the pixel electrode 114 and the capacitor top electrode 314 are formed at the same time. In other embodiments, after forming the source and drain electrodes 216s and 216d and the light-reflecting portion 116, the pixel electrode 114 and the capacitor top electrode 314 can be formed by additional etching. The pixel electrode 114 of the first electrode pattern 110 (see FIG. 8) is formed by removing the exposed second conductive layer 15. In the second electrode pattern 310 (see FIG. 8), the exposed, second conductive layer 15 is removed to form the capacitor top electrode 314. Thus, the gate bottom electrode 214, the capacitor top electrode 314, and the pixel electrode 114 are formed on the same layer and of the same material. In other embodiments, the capacitor top electrode 314 can be formed at once by using a half-tone mask and without forming the second electrode pattern 310.

As the second conductive layer 15 is removed from the second electrode pattern 310 (see FIG. 8), the capacitor bottom electrode 312 may be doped by injecting n-type or p-type impurities through the fifth opening H5. The impurities to be injected when doping the capacitor bottom electrode 312 can be the same as, or different from, those used in doping the active layer 212. Since the whole second electrode pattern 310 is exposed through the fifth opening H5, a wiring unit (not shown) that is connected to the capacitor bottom electrode 312 may be doped completely with ion impurities. Accordingly, as there is no area which is not doped with ions in the capacitor bottom electrode 312 and the wiring unit, electrostatic capacity may be increased and signal transmission quality may be improved.

Figure 10:
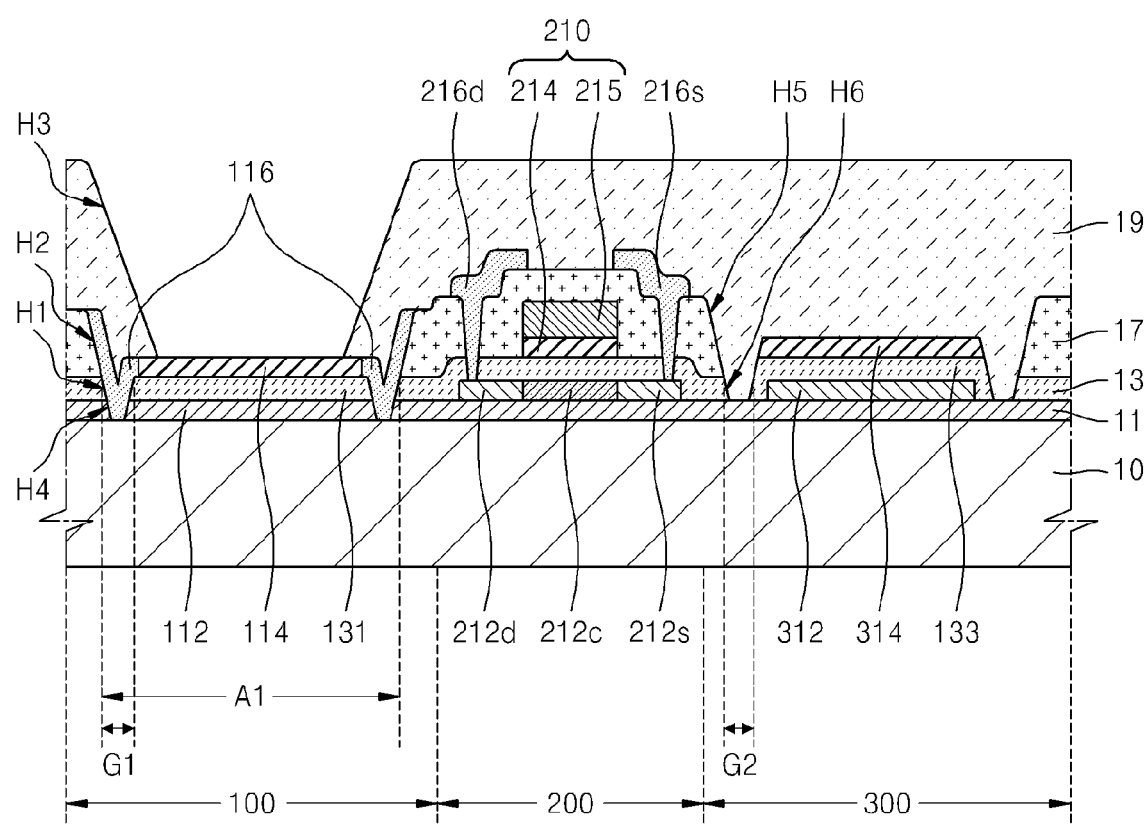

Next, as illustrated in FIG. 10, the third insulating layer 19 is formed on the substrate 10 as a pixel-defining layer (PDL).

The third insulating layer 19 is deposited on the entire surface of the substrate 10 on which the pixel electrode 114, the source and drain electrodes 216s and 216d, and the capacitor top electrode 314 are formed.

The third insulating layer 19 can be formed using at least one organic insulating material selected from the group consisting of polyimide, polyamide, acrylic resin, benzocyclobutene, and phenolic resin, by using a method such as, for example, a spin coating method. The third insulating layer 19 can be formed of not only the above-described organic insulation materials, but also of inorganic insulating materials selected from the group consisting of $SiO_2$, $SiNx$, $Al_2O_3$, $CuOx$, $Tb_4O_7$, $Y_2O_3$, $Nb_2O_5$, and $Pr_2O_3$. The third insulating layer 19 can be formed in a multi-layer structure in which an organic insulating material and an inorganic insulating material are alternately formed.

The third insulating layer 19 is formed in the second gap G2. When the third insulating layer 19 is formed of an organic insulating material, the second gap G2 can be appropriately filled with the organic insulating material, thereby preventing a short circuit which may occur between the capacitor bottom electrode 312 and the capacitor top electrode 314.

The third insulating layer 19 can be patterned as the PDL by using a mask operation in which a fifth mask (not shown) is used to form a third opening H3 that exposes a center portion of the pixel electrode 114 and thus to define pixels.

Then, an intermediate layer 118 (see FIG. 2) comprising an organic EML and an opposite electrode 119 are formed in the third opening H3 that exposes the pixel electrode 114.

The intermediate layer 118 can be formed as a stack structure in which at least one of a plurality of functional layers such as an organic EML, a hole transport layer (HTL), a hole injection layer (HIL), an electron transport layer (ETL), and an electron injection layer (EIL) is stacked in a single-layer structure or a multi-layer structure.

The organic EML can include low-molecular weight organic materials or polymer organic materials.

When the organic EML is formed of a low-molecular weight organic material, the intermediate layer 118 can include an HTL and an HIL from the organic EML in a direction towards the pixel electrode 114, and an ETL and an EIL from the organic EML in a direction towards the opposite electrode 119. Other layers may be stacked according to necessity. Examples of organic materials include copper phthalocyanine (CuPc), N,N'-Di(naphthalene-1-yl)-N,N'-diphenyl-benzidine (NPB), tris-8-hydroxyquinoline aluminum (Alq3), and the like.

In embodiments where the organic EML is formed of a polymer organic material, the intermediate layer 118 may include only an HTL from the organic EML in a direction toward the pixel electrode 114. The HTL may be formed on the pixel electrode 114 using poly-(2,4)-ethylene-dihydroxy thiophene (PEDOT) or polyaniline (PANI) by using an inkjet printing method, a spin coating method, or the like. Examples of organic materials that may be used include polymer organic materials such as polyphenylene vinylene (PPV) and polyfluorene. The organic EML can be formed by using methods such as an inkjet printing method, a spin coating method, a laser-induced thermal imaging (LITI) method, or the like.

The opposite electrode 119 may be deposited on the entire surface of the substrate 10 as a common electrode. In the organic light-emitting display device 1, the pixel electrode 114 is used as an anode and the opposite electrode 119 is used as a cathode. However, the polarities of the electrodes can be switched in other embodiments.

When the organic light-emitting display device 1 is a bottom emission type display device in which an image is formed in a direction towards the substrate 10, the pixel electrode 114 can be a transparent electrode and the opposite electrode 119 can be a reflective electrode. The reflective electrode can be formed by depositing a thin layer using a metal having a small work function, such as Ag, Mg, Al, Pt, Pd, Au, Ni, Nd, Ir, Cr, Li, Ca, LiF/Ca, LiF/Al, or a combination of these.

In each mask operation of the method of manufacturing the above-described organic light-emitting display device 1, the stacked layers can be removed using a dry etching method or a wet etching method.

In bottom emission type display device embodiments, a metal layer is formed in a lowermost portion of a substrate, separately from a pixel electrode, without increasing the number of masks. Accordingly, light emission efficiency of the pixel electrode is increased and etching characteristics of a gate electrode are provided, thereby increasing the display quality of a display device and simplifying the manufacturing process and reducing defects of the display device.

While an organic light-emitting display device has been described as an example, the present invention also applies to other display devices such as a liquid crystal display devices, and the like.

In addition, while only one TFT and one capacitor are illustrated in the drawings, for convenience of description, the number thereof is not limited thereto. As long as the number of mask operations according to the embodiments of the present invention is not increased, a plurality of TFTs and a plurality of capacitors may be included.

According to the embodiments of the present invention, the manufacturing process of the organic light-emitting display device is simplified. A surface area of a light emission area is increased, thereby improving an aperture ratio of the organic light-emitting display device. The light efficiency of the organic light-emitting display device is increased by using a light-reflecting portion.

While the present invention has been particularly shown and described with reference to certain embodiments thereof, it will be understood by those of ordinary skill in the art that various changes in form and details may be made therein without departing from the spirit and scope of the present invention as defined by the following claims.

What is claimed is:

1. An organic light-emitting display device comprising:
an active layer formed on a substrate;
a first insulating layer formed on the substrate, the first insulating layer covering the active layer and including a first opening and a first insulation island, wherein the first insulation island is formed in the first opening and is separated from an inner surface of the first opening;
a gate electrode formed on the first insulating layer insulating the gate electrode from the active layer, the gate electrode comprising a gate bottom electrode and a gate top electrode;
a pixel electrode formed on the first insulation island on the same layer as the gate bottom electrode of the gate electrode;
source and drain electrodes insulated from the gate electrode and electrically connected to the active layer;
a second insulating layer disposed between the gate electrode and the source and drain electrodes, the second insulating layer including a second opening exposing the entire pixel electrode;
a light-reflecting portion formed in the first opening and the second opening, and surrounding the pixel electrode;
an intermediate layer formed on the pixel electrode and comprising an organic emissive layer; and
an opposite electrode facing the pixel electrode with the intermediate layer between the opposite electrode and the pixel electrode.

2. The organic light-emitting display device of claim 1, wherein inner surfaces of the first opening and the second opening are connected to each other.

3. The organic light-emitting display device of claim 1, wherein a gap is formed between an outer edge of the pixel electrode and an inner surface of the second opening, and the light-reflecting portion is disposed in the gap.

4. The organic light-emitting display device of claim 1, wherein a first side of the light-reflecting portion is at the height of an upper surface of the pixel electrode, and a second side of the light-reflecting portion is at the height of an upper surface of the second insulating layer.

5. The organic light-emitting display device of claim 1, wherein the light-reflecting portion directly contacts the pixel electrode.

6. The organic light-emitting display device of claim 1, wherein the light-reflecting portion comprises the same material as the source and drain electrodes.

7. The organic light-emitting display device of claim 1, further comprising a third insulating layer disposed on the source and drain electrodes and the light-reflecting portion, the third insulating layer comprising a third opening exposing a center portion of the pixel electrode.

8. The organic light-emitting display device of claim 1, further comprising an auxiliary layer disposed between the substrate and the active layer,
wherein the auxiliary layer comprises a fourth opening having an inner surface connected to an inner surface of the first opening, and a second insulation island formed in the fourth opening and separated from the inner surface of the fourth opening.

9. The organic light-emitting display device of claim 8, wherein the light-reflecting portion is formed in the fourth opening.

10. The organic light-emitting display device of claim 1, wherein the gate bottom electrode and the pixel electrode comprise a transparent conductive material.

11. The organic light-emitting display device of claim 10, wherein the transparent conductive material comprises at least one material selected from the group consisting of indium tin oxide (ITO), indium zinc oxide (IZO), zinc oxide (ZnO), indium oxide ($In_2O_3$), indium gallium oxide (IGO), and aluminum zinc oxide (AZO).

12. The organic light-emitting display device of claim 10, wherein the opposite electrode is a light reflective electrode.

13. The organic light-emitting display device of claim 1, further comprising:
a capacitor bottom electrode formed on the same layer as the active layer, the capacitor bottom electrode comprising a semiconductor material doped with impurities; and
a capacitor top electrode formed on the same layer as the gate bottom electrode to correspond to the capacitor bottom electrode, the capacitor top electrode comprising a transparent conductive material.

14. The organic light-emitting display device of claim 1, wherein the second insulating layer further comprises a fifth opening exposing the whole capacitor top electrode.

15. The organic light-emitting display device of claim 14, wherein the first insulating layer further comprises a sixth opening having an inner surface connected to an inner surface of the fifth opening and a third insulation island formed in the sixth opening and separated from an inner surface of the sixth opening, wherein the third insulation island corresponds to the capacitor top electrode.

16. A method of manufacturing the organic light-emitting display device of claim 1, the method comprising:

forming a semiconductor layer on the substrate, wherein the semiconductor layer is patterned to form the active layer;

sequentially stacking the first insulating layer, a first conductive layer, and a second conductive layer on the active layer, wherein the first conductive layer and the second conductive layer are patterned to form a first electrode pattern and the gate electrode;

forming the second insulating layer on the first electrode pattern and the gate electrode, wherein the first insulating layer and the second insulating layer are patterned to form a plurality of openings that expose the whole first electrode pattern and portions of the active layer;

forming a third conductive layer on the second insulating layer, wherein the third conductive layer is patterned to form source and drain electrodes that are electrically connected to the active layer, and the second conductive layer which constitutes the first electrode pattern is removed to form the pixel electrode and to form the light-reflecting portion in the plurality of openings to surround the pixel electrode; and forming a third insulating layer on the pixel electrode and the light-reflecting portion, wherein the third insulating layer is patterned to expose a center portion of the pixel electrode.

17. The method of claim 16, further comprising doping the active layer with impurities to form source and drain areas.

18. The method of claim 16, further comprising patterning the second insulating layer to form a second opening that exposes the whole first electrode pattern, and patterning the first insulating layer at the same time to form a first opening connected to the second opening and a first insulation island in the first opening, wherein the first insulation island is separated from the first opening and corresponds to the first electrode pattern.

19. The method of claim 18, further comprising forming an auxiliary layer on the substrate, wherein forming an auxiliary layer comprises patterning the auxiliary layer to form a fourth opening that is connected to the first opening and the second opening and a second insulation island in the fourth opening, wherein the second insulation island is separated from an inner surface of the fourth opening and corresponds to the first insulation island.

20. The method of claim 16, further comprising forming an intermediate layer comprising an emissive layer and an opposite electrode on the pixel electrode.

21. The method of claim 16, further comprising patterning the semiconductor layer to form a capacitor bottom electrode on the same layer as the active layer, and patterning the first conductive layer and the second conductive layer to form a second electrode pattern which is used to form a capacitor top electrode corresponding to the capacitor bottom electrode.

22. The method of claim 21, further comprising patterning the first insulating layer and the second insulating layer to form openings that expose the whole second electrode pattern.

23. The method of claim 22, the second conductive layer constituting the second electrode pattern is removed to form the capacitor top electrode, and wherein the method further comprises doping the capacitor bottom electrode with impurities.

* * * * *